US006316791B1

(12) United States Patent
Schörner et al.

(10) Patent No.: US 6,316,791 B1
(45) Date of Patent: Nov. 13, 2001

(54) SEMICONDUCTOR STRUCTURE HAVING A PREDETERMINED ALPHA-SILICON CARBIDE REGION, AND USE OF THIS SEMICONDUCTOR STRUCTURE

(75) Inventors: Reinhold Schörner, Grossenseebach; Dietrich Stephani, Bubenreuth; Dethard Peters, Höchstadt; Peter Friedrichs, Nürnberg, all of (DE)

(73) Assignee: SiCED Electronics Development GmbH & Co. KG, Erlangen (DE)

( * ) Notice: Subject to any disclaimer, the term of this patent is extended or adjusted under 35 U.S.C. 154(b) by 0 days.

(21) Appl. No.: 09/523,158

(22) Filed: Feb. 22, 2000

Related U.S. Application Data

(63) Continuation of application No. PCT/DE98/00931, filed on Apr. 1, 1998.

(30) Foreign Application Priority Data

Aug. 20, 1997 (DE) .............................. 197 36 211

(51) Int. Cl.⁷ .................................................. H01L 29/76
(52) U.S. Cl. .................................................. 257/77
(58) Field of Search ...................... 257/76, 77, 296, 257/324, 330, 331–335, 341, 342, 346, 350, 628; 438/105, 931

(56) References Cited

U.S. PATENT DOCUMENTS 5,506,421   4/1996  Palmour .
5,798,293 * 8/1998  Harris ...................................... 438/459
5,814,859 * 9/1998  Ghezzo et al. ......................... 257/335

FOREIGN PATENT DOCUMENTS 0 637 069 A1   2/1995  (EP) .

OTHER PUBLICATIONS

Japanese Patent Abstract No. 63262871 (Yoshihisa), dated Oct. 31, 1988.
International Patent Application WO 94/13017 (Palmour), dated Jun. 9, 1994.
International Patent Application WO 96/19834 (Harris et al.), dated Jun. 27, 1996.
S. Yoshida: "Band structure of SiC: overview", in Gary L. Harris (ed.): "Properties of Silicone Carbide", INSPEC, the Institution of Electrical Engineers, London, United Kingdom, 1995, pp. 74–80.
Jayarama N. Shenoy et al.: "High–Voltage Doule–Implanted Power MOSFET's in 6H–SiC", IEEE Electron Device Letters, vol. 18, No. 3, Mar. 1997, pp. 93–95.
D. Widmann et al.: "Technologie hochintegrierter Schaltungen", Springer–Verlag, Berlin, 1988, pp. 64, 65, 74–77, technology of highly integrated circuits.

* cited by examiner

*Primary Examiner*—Olik Chaudhuri
*Assistant Examiner*—Vikki Hoa B. Trinh
(74) *Attorney, Agent, or Firm*—Herbert L. Lerner; Laurence A. Greenberg; Werner H. Stemer

(57) ABSTRACT

A semiconductor structure includes at least one α-silicon carbide region and an electrically insulating region, e.g. made of an oxide layer, and an interface located between them. The selection of an α-silicon carbide polytype having a smaller energy gap than that of the 6H silicon carbide polytype for at least one region near the interface results in a high charge carrier mobility in this region.

18 Claims, 1 Drawing Sheet

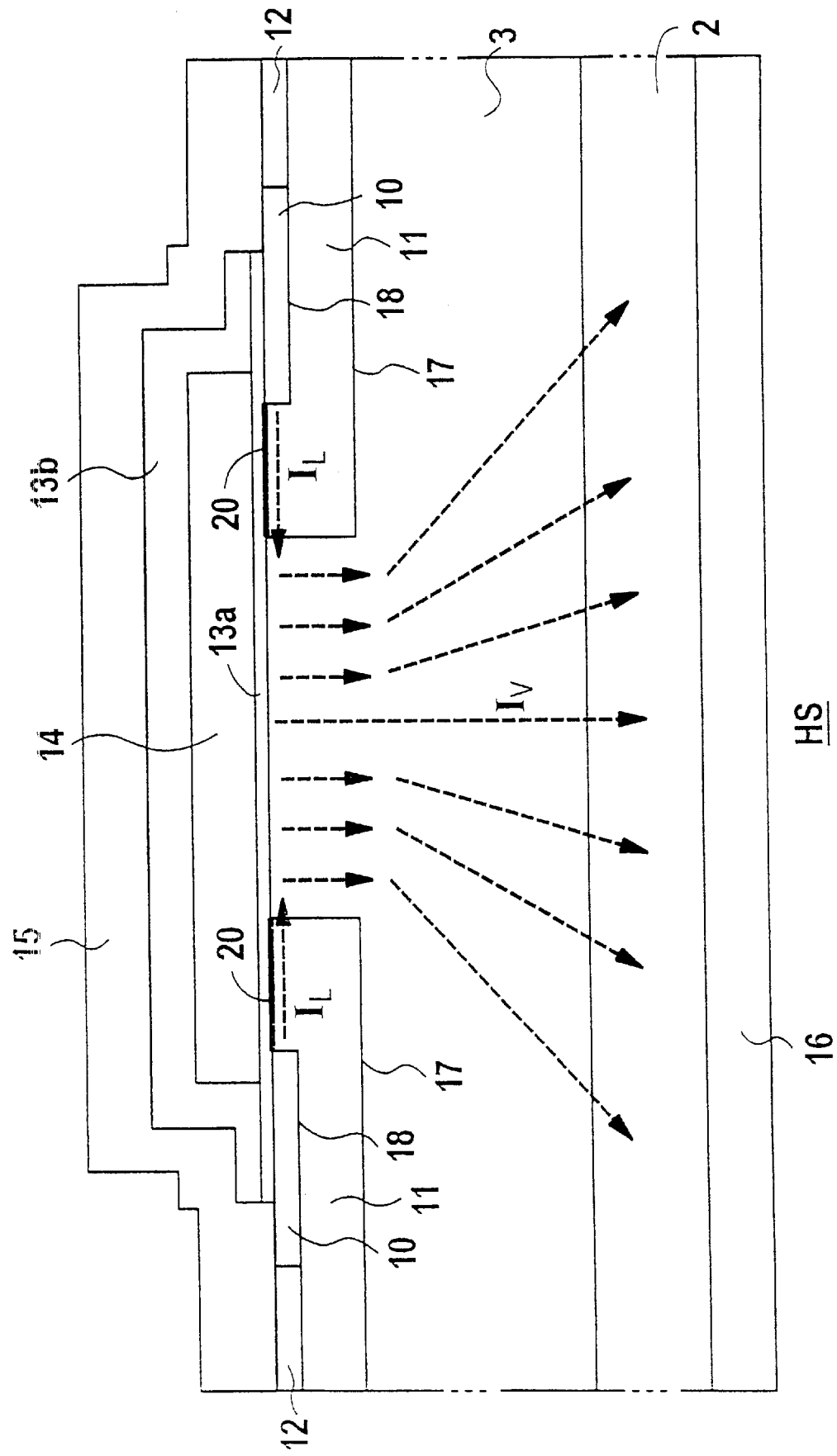

SEMICONDUCTOR STRUCTURE HAVING A PREDETERMINED ALPHA-SILICON CARBIDE REGION, AND USE OF THIS SEMICONDUCTOR STRUCTURE

CROSS-REFERENCE TO RELATED APPLICATION

This application is a continuation of copending International Application PCT/DE98/00931, filed Apr. 1, 1998, which designated the United States.

BACKGROUND OF THE INVENTION

1. Field of the Invention

The invention relates to a semiconductor structure containing an interface between a region made of a predetermined α-silicon carbide polytype and an electrically insulating region, wherein the electrical conductivity in the silicon carbide region at the interface can be altered by means of induced charges. Semiconductor structures of this type are disclosed e.g. in "IEEE Electron Device Letters", Vol. 18, No. Mar. 3, 1997, pages 93 to 95. The invention also relates to the use of the aforementioned semiconductor structure.

Silicon carbide in monocrystalline form is a semiconductor material with outstanding physical properties that make this semiconductor material of interest particularly for power electronics, even for applications in the kV range, inter alia on account of its high breakdown field strength and its good thermal conductivity. Since the commercial availability of monocrystalline substrate wafers, especially wafers made of 6H and 4H silicon carbide polytypes, has grown, silicon carbide-based power semiconductor components, such as silicon carbide Schottky diodes, are now also receiving more and more attention. However, the unipolar silicon carbide power MOSFETS known to date still pose problems concerning important properties, such as forward resistance (also known as on-resistance).

Energy gaps of silicon carbide polytypes will be discussed quite frequently below. It is understood here that the energy gap values that are to be used for the comparison have to be determined under the premise of identical preparation, measurement and ambient conditions. The values cited below each apply to room temperature. "Properties of Silicon Carbide", edited by G. L. Harris, INSPEC publishers, London, GB, 1995, pages 74–80, documents the energy gaps at a temperature of 4 K for various silicon carbide polytypes.

IEEE Electron Device Letters, Vol. 18, No. Mar. 3, 1997, pages 93 to 95, discloses a unipolar MOSFET fabricated on the basis of a 6H silicon carbide wafer by double ion implantation (so-called DI-MOSFET). In a DI-MOSFET of this type the current is controlled in a semiconductor region made of silicon carbide with lateral current flow, the so-called channel zone which is situated in the silicon carbide region at an interface between the silicon carbide semiconductor region and an electrically insulating region (e.g. $SiO_2$). Afterwards, the current is passed vertically through the component in a second silicon carbide semiconductor region, the so-called drift zone.

The DI-MOSFET disclosed affords an improvement of the forward resistance by comparison with the prior art. Further improvements, especially in the forward resistance, which essentially depends on the conductivity of the channel zone and of the drift zone, are promised in "IEEE Electron Device Letters", Vol. 18, No. Mar. 3, 1997, pages 93 to 95, by a change in material from the 6H silicon carbide polytype to the 4H silicon carbide polytype. This statement is based on considerations which take account only of the (bulk) conductivity in the drift zone. In the case of a vertical current flow in the direction of the crystallographic c-axis, the 4H silicon carbide polytype having a free charge carrier mobility of approximately 800 $cm^2V^{-1}s^{-1}$ determining the bulk conductivity clearly has an advantage over 6H silicon carbide, which only has a mobility of approximately 100 $cm^2V^{-1}s^{-1}$. However, this does not take account of the influence of polytype selection on the second influencing parameter that is critical for the forward resistance, namely the conductivity in the channel zone, which is determined by geometrical parameters and also essentially by the properties of the boundary layer between the silicon carbide semiconductor region and the electrically insulating region.

Palmour U.S. Pat. No. 5,506,421 discloses a semiconductor structure in the form of a silicon carbide MOSFET with a U- or V-shaped trench. Depending on the configuration of the trench, such a MOSFET is also referred to as a U- or V-MOSFET, respectively. The actual MOS structure is situated within the trench, with an electrically insulating region adjoining the trench wall. Within the silicon carbide region, the electrical conductivity can be altered, and thus a current flow can be controlled, in a channel zone adjoining the lateral trench wall. The preferred silicon carbide polytype for the silicon carbide region of the MOSFET is the 6H polytype. The 3C, 2H, 4H and 15R polytypes are mentioned as alternatives. The trench structure, in particular including the non-planar course of the interface towards the electrically insulating region, adversely affects the behavior of the semiconductor structure described in a particular manner. Thus, high electric field spikes are produced at the corners of the trench, above all in the electrically insulating region. As a result, however, the breakdown behavior in the off-state mode is impaired. In the on-state mode, too, the inclined or perpendicular orientation of the lateral trench walls with respect to the main surface of the silicon carbide region can lead to an unfavorable forward resistance of the channel zone.

SUMMARY OF THE INVENTION

It is accordingly an object of the invention to provide a semiconductor structure having a predetermined α-silicon carbide region, and the use of this semiconductor structure in a semiconductor component as well as in a semiconductor circuit including such a component, that overcomes the above-mentioned disadvantages of the prior art devices and methods of this general type, and in particular exhibits improved properties, such as improved forward resistance. A further object of the invention is for the semiconductor structure also to have good breakdown behavior. With the foregoing and other objects in view there is provided, according to the invention, a semiconductor structure comprising a semiconductor region made of a predetermined α-silicon carbide polytype other than a 4H and a 6H polytype, an electrically insulating region, a planar interface between these regions, and a channel zone adjoining the planar interface in the silicon carbide region, in which the energy gap of the silicon carbide region is equal to or less than that of the 6H silicon carbide polytype, the electrically insulating region contains a silicon oxide and/or a silicon nitride at least in a layer adjoining the interface, the electrical conductivity in the silicon carbide region at the interface can be altered by means of induced charges, and a current controllable by the variable electrical conductivity adjoining the planar interface in the silicon carbide region is guided laterally in the channel zone.

With the above and other objects in view, there are also provided, according to this invention, a semiconductor component comprising a silicon carbide substrate and a semiconductor structure according to the invention, and a semiconductor circuit in which a semiconductor component according to the invention is incorporated. In the semiconductor component according to the invention, the silicon carbide substrate and the semiconductor structure of the invention can be of the same conduction type or of opposite conduction types.

The invention is based on the discovery that the distribution of the electrically active defects (traps) at the interface between a semiconductor region and an electrically insulating region determines the conductivity of the semiconductor at the interface and, consequently, essentially determines the forward resistance of the complete semiconductor structure. Investigations of silicon carbide have shown that an energy band having a high defect density forms irrespective of the polytype, with a fixed energy gap between this energy band and the valence band. This band has a lower boundary which is rather sharply delimited in energy terms and is approximately 2.9 eV above the valence band boundary. Since the energy position of the valence band is independent of the polytype of silicon carbide, selecting the polytype according to the invention ensures that the defect band lies within the conduction band in energy terms and thus influences the conductivity to a significantly lesser extent than is the case with the customarily used polytypes having a higher energy gap.

Selecting the α-silicon carbide polytype according to the invention also results in advantageous semiconductor structures having improved properties by comparison with the prior art in addition to the features mentioned in the preamble. In particular the forward resistance can advantageously be reduced, e.g. by a factor of 20.

With the above and other objects in view, additional advantageous refinements of the semiconductor structure according to the invention emerge from the embodiments described below. The following can be regarded as being particularly advantageous.

In a particularly preferred embodiment of the semiconductor structure, the α-silicon carbide semiconductor region has an energy gap at least 5 meV (milli-electron volts) smaller than that of the 6H silicon carbide polytype. The rhombohedral α-silicon carbide polytypes (R type), in particular the 15R type and the 21R type, are particularly advantageous. At room temperature, 15R silicon carbide has an energy gap of 2.79 eV which, according to the invention, lies below the comparison value of 6H silicon carbide (2.91 eV). The 4H and 6H silicon carbide polytypes which are excluded according to the invention are not suitable polytypes on account of their high energy gaps of 3.15 eV (4H silicon carbide) and 2.91 eV (6H silicon carbide), despite the fact that heretofore they have been used almost exclusively in silicon carbide power electronics.

Also in accordance with this invention, advantageous charge carrier mobilities perpendicular to the crystallographic C-axis in the region of the interface (channel zone) of the semiconductor structure result for the 15R silicon carbide polytype (greater than or equal to 40 $cm^2V^{-1}s^{-1}$), whereas the corresponding values for 4H silicon carbide (less than or equal to 1 $cm^2V^{-1}s^{-1}$) and for 6H silicon carbide (>20 $cm^2V^{-1}s^{-1}$) are distinctly lower. To date, the charge carrier mobility in the adjoining drift zone through the substrate volume parallel to the crystallographic c-axis, which is more favorable with 800 $cm^2V^{-1}s^{-1}$ in the case of 4H silicon carbide compared to 330 $cm^2V^{-1}s^{-1}$ l in the case of 15R silicon carbide, has been deemed critical for the forward resistance. Despite this, however, on account of the above-described interface influences on the charge carrier mobility in the channel zone, the resulting forward resistance of 4H silicon carbide is higher by a factor of 20 than that of 15R silicon carbide.

A further advantageous embodiment benefits from the fact that, in order to attain the advantageous conductivity at the interface, only a narrow semiconductor region in direct proximity to the electrically insulating region must be formed from the selected α-silicon carbide polytype according to the invention. Thus, semiconductor regions adjoining this narrow region in direct proximity to the electrically insulating region can be composed either of the same silicon carbide polytype or at least partly of a different silicon carbide polytype or a semiconductor material other than silicon carbide, or of a complex construction with at least one semiconductor material other than silicon carbide.

In a further advantageous embodiment, the semiconductor structure according to the invention can be a MOSFET structure, in particular a DI-MOSFET structure, or an IGBT structure. Structures of this type are frequently used in power electronics.

It is particularly advantageous, moreover, if the semiconductor structure according to the invention is used to construct a semiconductor component or a complex semiconductor circuit.

Other features which are considered as characteristic for the invention are set forth in the appended claims.

Although the invention is illustrated and described herein as embodied in a semiconductor structure having a predetermined α-silicon carbide region, and use of this semiconductor structure, it is nevertheless not intended to be limited to the details shown, since various modifications and structural changes can be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The single FIGURE of the Drawing diagrammatically illustrates a DI-MOSFET according to the invention.

DESCRIPTION OF THE PREFERRED EMBODIMENTS

DI-MOSFET components, such as the semiconductor structure which is indicated in the figure and designated by HS, are important unipolar power components. In such components, the current is on the one hand controlled by means of a lateral current flow IL and is on the other hand guided through the component by means of a vertical current flow IV in the drift zone composed of a silicon carbide semiconductor layer 3 and a silicon carbide substrate 2.

In this connection, vertical current flow is to be understood to mean a current flow in a direction running perpendicular to a planar interface 20 of the silicon carbide semiconductor layer 3. Correspondingly, lateral is to be understood to mean a direction running parallel to a direction within said interface 20.

One of the determining parameters for the forward resistance of the DI-MOSFET component is the conductivity in the region of the lateral current path IL, the so-called channel. These channels form in the on state, as a result of induced charges, as regions of larger base regions 11 which are adjacent to planar interfaces 20. The crucial interfaces 20 are emphasized by bolder lines in the figure. The semiconductor structure is situated exactly in these regions of the DI-MOSFET component. At least this region of the base region 11, which is near the interface and adjoins the electrically insulating region formed by a first insulating material layer 13a, is composed of an α-silicon carbide polytype with a smaller energy gap than that of 6H silicon carbide. A 15R silicon carbide polytype, or a 21R silicon carbide polytype, for example, is suitable. It must thus be ensured that the desired advantageously high channel conductivity and, as a consequence thereof, the low forward resistance of the structure are established.

The electrically insulating region disposed above the base region 11 can be constructed of a single layer, as in the exemplary embodiment illustrated in the figure. In accordance with other advantageous embodiments, however, a plurality of layers, preferably made of different materials, can also be provided for this region.

L 4–5 in particular and preferably of thermal $SiO_2$ material, such as silicon dioxide afforded by the oxidation of elemental silicon at an elevated temperature.

The first insulating material layer 13a (illustrated in the FIGURE), the so-called gate oxide, can advantageously be composed of $SiO_2$ material, in particular of thermal $SiO_2$ material. However, in other embodiments, this layer can also be composed of a non-oxidic electrically insulating material, in particular of $Si_3N_4$ silicon nitride.

The method of operation of the DI-MOSFET components of FIG. 1 is explained in more detail below. Source regions are designated by 10, base regions by 11, base contact regions by 12, a first insulating layer by 13a, a second insulating layer by 13b, a gate electrode by 14, a source electrode by 15 and a drain electrode by 16. The second insulating layer 13b (insulating silicon oxide and/or nitride) serves to effect insulation between gate electrode 14 and source electrode 15 and is composed of an $SiO_2$ deposited by means of an LPCVD process (Low Pressure Chemical Vapor Deposition). Each base region 11 is implanted as a 15R silicon carbide or 21R silicon carbide semiconductor region into a silicon carbide layer 3 grown epitaxially on a silicon carbide substrate 2 and is doped oppositely to the silicon carbide layer 3. The p-n junctions 17 formed in each case between the base regions 11 and the silicon carbide layer 3 essentially take up the reverse voltage when the DI-MOSFET component is reverse-biased. At least one source region 10 doped oppositely to the base region 11 is implanted into each base region 11, and therefore forms a respective p-n junction 18 of the source region 10 with the associated base region 11. Each source region 10 is electrically short-circuited with the associated base region 11 via the source electrode.

The base regions 11 are preferably doped with boron and are consequently p-conducting. Moreover, they can be doped more heavily by additional implantation of aluminum for a higher latch-up strength underneath the source region 10 and in the base contact region 12 at the source electrode 15, and thus be $p^+$-conducting. The source regions 10 and the silicon carbide layer 3 are preferably doped with nitrogen and are thus n-conducting. The drain electrode 16 is disposed on that side of the silicon carbide substrate 2 which is remote from the silicon carbide layer 3. In particular, an implanted, more heavily doped drain region can also be provided in the silicon carbide substrate 2. The DI-MOSFET thus has a vertical construction.

If, in the embodiment illustrated, the silicon carbide substrate 2 is of the same conduction type as the silicon carbide layer 3 that has been grown upon it, then a MOSFET structure is present. If, on the other hand, the silicon carbide substrate 2 is of the opposite conduction type to the silicon carbide layer 3, then between layer 3 and substrate 2 an additional pn junction is connected between source electrode 15 and drain electrode 16 and an IGBT structure is present in that case.

It is understood that the conduction types of all the semiconductor regions mentioned may also be interchanged in each case.

We claim:

1. A semiconductor structure having breakdown behavior and forward resistance, comprising;
   semiconductor region made of a predetermined α-silicon carbide polytype other than a 4H and a 6H polytype;
   an electrically insulating region;
   a planar interface between said semiconductor region and said electrically insulating region;
   a channel zone adjoining said planar interface in said semiconductor region;
   an energy gap of said semiconductor region less than that of the 6H silicon carbide polytype;
   said electrically insulating region containing a thermal silicon oxide or a silicon nitride at least in a layer adjoining said interface;
   the electrical conductivity in the silicon carbide region at said interface to be altered by induced charges; and
   a current controllable by the variable electrical conductivity adjoining said planar interface in said silicon carbide region guided laterally in said channel zone.

2. The semiconductor structure according to claim 1, wherein said energy gap is smaller than that of the 6H silicon carbide polytype by at least 5 milli-electron volts.

3. The semiconductor structure according to claim 1, wherein said α-silicon carbide polytype is an R type.

4. The semiconductor structure according to claim 3, wherein the R type is a 15R type or a 21R type.

5. The semiconductor structure according to claim 1, wherein said electrically insulating region is formed of thermal $SiO_2$.

6. The semiconductor structure according to claim 1, wherein said electrically insulating region is formed by a plurality of layers.

7. The semiconductor structure according to claim 6, wherein said electrically insulating region includes a layer of $SiO_2$ and at least one layer formed of silicon nitride.

8. The semiconductor structure according to claim 1, wherein all of said semiconductor region is made of the same α-silicon carbide polytype.

9. The semiconductor structure according to claim 1, including at least one additional semiconductor region.

10. The semiconductor structure according to claim 9, wherein said at least one additional semiconductor region includes a second silicon carbide polytype.

11. The semiconductor structure according to claim 10, wherein said at least one additional semiconductor region includes a semiconductor material other than silicon carbide.

12. A semiconductor component, comprising a silicon carbide substrate and a semiconductor structure according to claim 1.

13. The semiconductor structure of claim 1, wherein the forward resistance is at most one-twentieth that of a semiconductor structure having a semiconductor region made of a 4H polytype α-silicon carbide.

14. The semiconductor structure of claim 1, wherein the entire interface between said semiconductor region and said electrically insulating region is planar.

15. The semiconductor structure of claim 1, further comprising a drift zone within said semiconductor region adjacent to said channel zone, wherein the controllable current within said channel zone is conducted vertically through said drift zone and flows substantially parallel to the crystallographic c-axis of said α-silicon carbide polytype.

16. A MOSFET structure, comprising a semiconductor component according to claim 12, wherein said substrate and said semiconductor structure are of the same conduction type.

17. An IGBT structure, comprising a semiconductor component according to claim 12, wherein said substrate and said semiconductor structure are of opposite conduction types.

18. A semiconductor circuit, comprising a semiconductor component according to claim 12.

* * * * *